(12) United States Patent
Crouch

(10) Patent No.: US 10,909,284 B1
(45) Date of Patent: Feb. 2, 2021

(54) METHOD AND SYSTEM FOR SELECTION OF LOCATION FOR PLACEMENT OF TROJANS, TRIGGERS AND INSTRUMENTS WITHIN INTEGRATED CIRCUITS AND ELECTRONIC SYSTEMS USING WEIGHTED CONTROLLABILITY AND OBSERVABILITY ANALYSIS

(71) Applicant: Amida Technology Solutions, Inc., Washinton, DC (US)

(72) Inventor: Alfred Larry Crouch, Cedar Park, TX (US)

(73) Assignee: Amida Technology Solutions, Inc., Washington, DC (US)

( * ) Notice: Subject to any disclaimer, the term of this patent is extended or adjusted under 35 U.S.C. 154(b) by 0 days.

(21) Appl. No.: 16/775,658

(22) Filed: Jan. 29, 2020

(51) Int. Cl.
 *G06F 30/32* (2020.01)
 *G06F 30/39* (2020.01)
 *G06F 30/327* (2020.01)
 *G06F 30/392* (2020.01)
 *G06F 30/323* (2020.01)

(52) U.S. Cl.
 CPC .......... *G06F 30/327* (2020.01); *G06F 30/323* (2020.01); *G06F 30/392* (2020.01)

(58) Field of Classification Search
 CPC ..... G06F 30/392; G06F 30/323; G06F 30/327
 USPC ........................................ 716/101, 103, 104
 See application file for complete search history.

(56) References Cited

U.S. PATENT DOCUMENTS

| | | | | |
|---|---|---|---|---|
| 9,735,781 | B2 * | 8/2017 | Cocchi et al. | ... H03K 19/17736 |
| 10,574,237 | B2 * | 2/2020 | Cocchi et al. | .......... G06F 30/39 |

* cited by examiner

*Primary Examiner* — Sun J Lin
(74) *Attorney, Agent, or Firm* — Hunt Pennington Kumar & Dula, PLLC; Artie Pennington

(57) ABSTRACT

A method and system for analysis of an electronic facility may include providing a mathematical analysis using a scoring system to make generalization about a design and select locations for placement of trojans, triggers and trojan detection instruments within an electronic facility. Such mathematical analysis may include Controllability-Observability analysis as applied to trojan insertion and attacks, and trojan detection instruments.

8 Claims, 11 Drawing Sheets

METHOD AND SYSTEM FOR SELECTION OF LOCATION FOR PLACEMENT OF TROJANS, TRIGGERS AND INSTRUMENTS WITHIN INTEGRATED CIRCUITS AND ELECTRONIC SYSTEMS USING WEIGHTED CONTROLLABILITY AND OBSERVABILITY ANALYSIS

FIELD OF THE INVENTION

The disclosure relates generally to methods, systems, and apparatus for security assurance, protection, monitoring and analysis of integrated circuits and electronic systems in relation to hardware trojans.

BACKGROUND OF THE INVENTION

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Electronic systems and facilities including circuits such as integrated circuits, chips, circuit boards, electronic devices, and components thereof, are subject to attacks and intrusions from malicious content or hardware trojans (hereinafter, collectively "hardware trojans"). As used herein, the term "hardware trojan" includes inherent malicious content or elements that may be included in a facility, and that may be exploited. For clarity, hardware trojans, as referenced herein, are to be distinguished from software trojans and related malicious software.

Hardware trojans, for example, may intend to function to break or prevent normal operation, allow unauthorized taking over or locking, steal data, steal circuit structure, degrade the hardware, degrade circuit operations, or inject errors into data being processed. A non-exhaustive listing of labels or references for hardware trojans includes, without limitation, the following: "denial of service" (DoS) indicating preventing the integrated circuit from conducting its normal function for some period of time; "ransomware" indicating the taking over or locking of an integrated circuit until a payment is extracted; "data theft" indicating that critical information stored or processed within the integrated circuit has been exfiltrated (such as, for example, customer information, account numbers and account passwords that can be used for identity theft and to access financial accounts); "structure theft" indicating that design or operation information concerning the electronic system or facility thereof has been exposed to enable reverse-engineering or counterfeiting; and "destructive operation" indicating that a facility or electronic system may be operated in such a manner as to provide physical damage (for example, operating built-in self-test logic (BIST) until a facility goes into thermal overload and physically melts).

The capability to allow these types of attacks stems from inadvertent or intentionally malicious content (i.e., "hardware trojans") included within the facility hardware, such as integrated circuit hardware. Instantiations of malicious content, both inadvertent and intentional, may be labeled or referenced by several names, but may be generally referred to as "security vulnerabilities" or "security exploits" (hereinafter, collectively, "security exploits"). Security exploits may be incorporated within a facility, or within an electronic system including a facility, at any point in design, development, integration, implementation, testing, programming, packaging, and distribution; or at any point in the design-manufacturing-distribution supply chain.

In the age of the internet, the internet-of-things ("IoT"), and ubiquitous home and business electronics, the prevalence of cyberattacks has become a key concern of many owners and users of those electronics. Many attacks source from, and make use of, the connection to the internet. Often overlooked, however, are the hardware trojans hidden, and embedded, and/or built right into the electronic hardware, i.e., trojan attacks. A trojan attack is the inclusion of hardware trojans within an electronic device. The trojan attack becomes realized when the trojan is activated and delivers its designated payload or takes its designated action. Trojans may be "always on" or may be triggered or activated by an event.

Trojans may be inserted into the electronic devices and systems at many different phases that include by way of example the design and development phase, the manufacturing phase, and the assembly phase. By way of example, trojan attacks may include non-specified features added to an original design, may be nefarious functions within a counterfeit function that is added to the design, e.g., IP cores within a semiconductor design, or that replaces a unit or device within the overall system, e.g., a counterfeit semiconductor device placed on a board.

More specifically, hardware trojans may be introduced into a facility, for example, when intellectual property ("IP") cores ("IP cores") are licensed from third parties for incorporation in an integrated circuit design. IP cores may include hidden trojan circuits providing various security exploits. So, for example, a design engineer acting with a nefarious purpose may include one or more trojan circuits to perform undesired functions, such as providing unsecured or readily enabled back-door access or memory space for future software viruses and malware. A design engineer also may design tools that generate, insert or synthesize circuit content, such as test and debug logic, that may be modified to include hardware trojans. A design engineer may design tools or provide implementations that operate on one form of design model to create a different, undesired form of design model. By way of example, logic synthesis from a behavioral model to a gate-level model may be mapped to the gate library that targets a specific fabrication facility. By way of a different example, design tools may provide a place-and-route conversion from a gate-level model to a physical model that adds and includes power, clock, electro-static-discharge ("ESD") protection structures, and those design tools may be corrupted by being designed to add hidden malicious content during the conversions.

Other means of trojan insertion include some scenarios where a circuit design may be passing through the fabrication process, e.g., in an IC foundry, and subtle changes in doping and chemical exposure may result in transistors, gates, signal routes and insulation layers not behaving properly in the final implemented silicon device. By way of example, the impacted elements may be sensitive to voltage levels or temperature levels or temperature ranges, or may produce unexpected emissions. By way of a different example, during the IC testing process, a programming step may place identification numbers or encryption codes or other defining steps for the integrated circuit device, and the test process may be altered to either provide incorrect values, or may place the values in alternate places within the device, where the misplaced values may be snooped or leaked in the future. Even when the sliced-and-diced silicon is packaged into plastic or ceramic chip carriers, devices may have unused signal connections or unused functions connected to package pins to be accessed by nefarious parties in the future. By way of example, a package pin may be accessed and act as a signal connection to leak data, but may be misidentified in the IC data book as a ground connection.

Hardware trojans may be incorporated within custom designs such as, for example, application specific integrated circuits ("ASIC"), or may be incorporated within designs destined to become standard parts. Examples may include application specific standard parts ("ASSP"), microprocessors, microcontrollers, systems-on-a-chip ("SOC"), and standardized memory chips ("DDR", "DIMM", "HBM", etc.). When electronic systems are made from these chips, either custom systems made from custom IC's or systems made from commercial-off-the-shelf ICs (COTS), there is a risk that one or multiple chips incorporated into the electronic design may be compromised, or that groupings of chips can be arranged together to allow access to trojan malicious content at the system level or to create complex trojan malicious content at the system level. In an example, a hardware trojan may provide back door access to secured kernel memory that holds a primary operating system.

Electronics manufacturers, producers, and providers have three basic strategies they may consider when providing electronic devices and systems that include consideration of a cybersecurity threat. As a first strategy, the provider can ignore adding or supporting any cybersecurity techniques and content if they believe that their electronics are inconsequential, e.g., not important enough to warrant an attack by nefarious individuals, industrial enemies or nation-states. This first strategy may also may be used if they have consequential electronics and simply do not wish to invest in any cybersecurity techniques due to the expense involved or the belief that the probability of a cyberattack is minimal. The second strategy that may be considered is to establish a defensive position that requires detecting the trojans and their triggers before they can activate and deliver their payload. And finally, the third strategy that may be considered is to assume that all electronics are infected and to invest in post-attack recovery techniques.

The strategy of ignoring cyber-hardening has been illustrated ineffectual because this strategy does not take into consideration that even inconsequential electronics such as TVs, DVRs, cameras, thermostats, light bulbs and household appliances may be used as BOTs to conduct distributed denial-of-service ("DDOS") or Domain-Name-Server ("DNS") attacks.

A defensive strategy requires utilizing detection mechanisms in and around the system of interest, where those detection mechanisms may be used to identify the assertion of specific triggering events, e.g., triggers assert, or to identify the activation of specific trojans within the system. A purely defensive strategy may suffer from what may be termed an "iceberg problem", e.g., even though one or more triggers or trojans is affirmatively detected within the system, the exact number of triggers and/or trojans in the system remains unknown. One strategy of a nefarious actor, e.g. a "black hat", may be to provide triggers and trojans within the system that are more easily found, thus masking more sophisticated trojans within the system.

A strategy that assumes infection of all electronics also suffers from the inherent detection issue of a defensive strategy. However, the goal with this strategy is to give more analytical weight to post trigger and attack recovery, rather than the prevention or simple detection of the attack. Post attack recovery inherently requires understanding the impact of the attack on the electronic system such that the consequences of the attack may be managed. And, in order to implement a recovery mechanism in the system that will be effective post deployment, the nature of the recovery must be analyzed and understood prior to the when electronic system is deployed. Said another way, this strategy is an integral part of the overall design of the electronic system.

In order to apply the defend strategy or the assume infection strategy, the different points where an unauthorized user may attack the electronic system or extract data from the electronic system, e.g., attack surface, must be understood. Ideally, the attack surface must be understood during the design process, or at the very least, before the system is deployed. There is not one single method that can ideally identify when or where an attack will occur, nor can a single method ideally identify where in the electronics the attack is located. Therefore, different analysis methods must be used to predict different types of attacks. The goal is to identify the most-likely, highest probability attacks and to evaluate the effect of those attacks through simulation or emulation.

One of us, Alfred Crouch, has developed certain improvements for use in the cybersecurity systems, which improvements are fully described in the following pending applications or issued patents, all of which are expressly incorporated herein in their entirety:

"Method, System and Apparatus for Security Assurance, Protection, Monitoring and analysis of Integrated Circuits and Electronic Systems in Relation to Hardware trojans", application Ser. No. 16/145,89, filed 28 Sep. 2018; and "Method, System and Apparatus for Security Assurance, Protection, Monitoring and analysis of Integrated Circuits and Electronic Systems in Relation to Hardware trojans", application Ser. No. 16/450,336, filed 24 Jun. 2019.

In reality, trojan effects can be launched from any gate connection or route in the design. However, there are some guidelines the black hat may use in selecting the best locations to place trojans such that the trojans will have the desired attack goal and so that the trojan will make it to the targeted activation point without being discovered. One guideline is: "minimum work or change for the maximum amount of damage or exposure." Another guideline, similar to fault collapsing and fault management, is "a trojan can be viewed as a fault/defect/bug placed by a human intelligence as opposed to imperfect design and manufacturing processes". More specifically, this means that the human intelligence will choose locations within the electronic system for trojan insertion and trigger conditions that are difficult to find, making it less likely for the trojan to be discovered before its planned use.

It is also highly unlikely that a trojan attack is the result of a simple analysis during manufacturing where the nefarious individual picks a single transistor, gate or route to modify—this may not result in the desired targeted attack, with the exception of a few easy attacks such as placing a triggered gating element across the widely distributed clock or reset lines. Any easy attack implemented at manufacturing can actually be easily discovered if an effort is made during silicon verification. It is more likely that the nefarious individual wishes to implement a more complex and stealthy attack and has information on the design, the behaviors, the functions and the application of the device they intend to infect with a trojan. An attack is then targeted to achieve the required attack goal. By way of example, an attack may be targeted to prevent the device from conducting its normal operations or to prevent the device from operating altogether, i.e., a kill switch, or to allow a device to be taken over and controlled, i.e., $3^{rd}$ party operation, ransomware, or to leak critical information or structure, i.e., to enable reverse engineering or to expose secret data, codes or keys. For a provider of electronics to defend against attacks or to provide countermeasures, requires the anticipation of most-likely attacks. Anticipation of the attacks have proven to be resistant to any single form of analysis and requires the evaluation of the design to be manufactured to be examined multiple different ways to predict the different types of trojan attacks and their impact on the deployed electronics.

For reasons stated above and for other reasons which will become apparent to those skilled in the art upon reading and understanding the present specification, there is a need in the art for improved methods, systems, and apparatus for security assurance, protection, monitoring and analysis of facilities and electronic systems including circuits, such as integrated circuits, in relation to hardware trojans.

BRIEF DESCRIPTION OF THE INVENTION

The above-mentioned shortcomings, disadvantages and problems are addressed herein, as will be understood by those skilled in the art upon reading and studying the following specification. This summary is provided to introduce a selection of concepts in simplified form that are further described below in more detail in the Detailed Description. This summary is not intended to identify key or essential features of the claimed subject matter.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In accordance with an embodiment in a computer implemented trojan analysis system, a method for selection of a location for placement and insertion of a selected one of a trojan circuit and an instrument circuit within an electronic facility, the electronic facility represented as a netlist, using weighted controllability and observability analysis, the method comprising the steps of: [1.0] developing a first controllability map of the electronic facility netlist, the first controllability map comprising a first plurality of controllability weighting factors; [2.0] developing a first observability map of the electronic facility netlist as a function of the first plurality of controllability weighting factors, the first observability map comprising a first plurality of observability weighting factors; [3.0] selecting a trojan site as a function of the first plurality of controllability weighting factors; [4.0] modifying the electronic facility netlist by inserting a trojan circuit into the electronic facility netlist at the trojan site; [5.0] developing a second controllability map of the modified electronic facility netlist as a function of the trojan circuit, the second controllability map comprising a second plurality of controllability weighting factors; [6.0] developing a second observability map of the electronic facility netlist as a function of the second plurality of controllability weighting factors, the second observability map comprising a second plurality of observability weighting factors; [7.0] selecting a trojan detection instrument site as a function of the second plurality of observability weighting factors; and [8.0] repeating steps [3.0] through [7.0] to develop a selected plurality of trojan and trojan detection instrument sites.

BRIEF DESCRIPTION OF THE DRAWINGS

The disclosed subject matter itself, as well as further objectives, and advantages thereof, will best be illustrated by reference to the following detailed description of embodiments of the device read in conjunction with the accompanying drawings, wherein.

Figure 1:
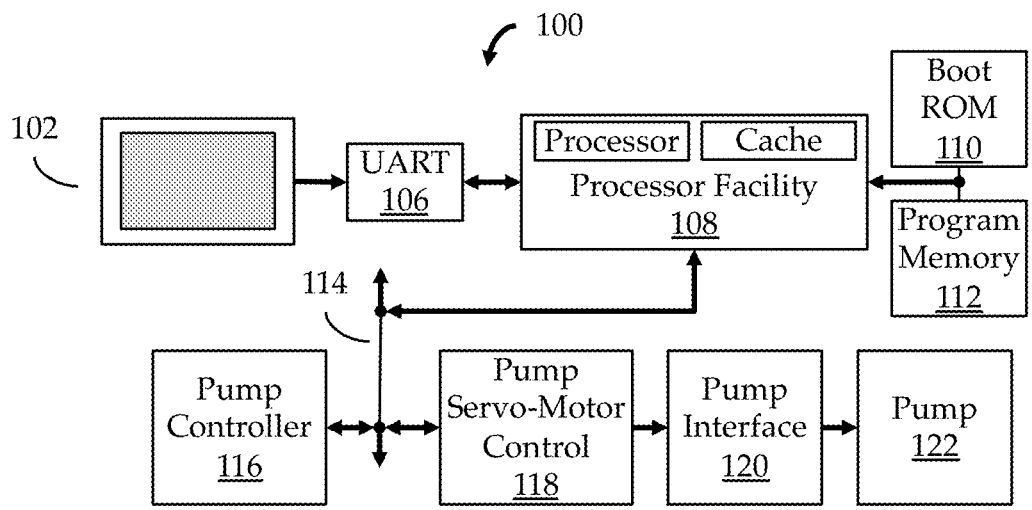
FIG. 1 illustrates, in block diagram form, an exemplary electronic facility that may be the subject of the aforementioned trojan attacks, and to the analytical methods described herein according to some embodiments.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

In this detailed description, reference is made to the accompanying drawings which form a part hereof, and in which is shown by way of illustration specific embodiments which may be practiced. These embodiments are described in sufficient detail to enable those skilled in the art to practice the embodiments and disclosure. It is to be understood that other embodiments may be utilized, and that logical, mechanical, electrical, and other changes may be made without departing from the scope of the embodiments and disclosure. In view of the foregoing, the following detailed description is not to be taken as limiting the scope of the embodiments or disclosure.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be appreciated that for simplicity and clarity of illustration, where considered appropriate, reference numerals may be repeated among the figures to indicate corresponding or analogous elements. In addition, numerous specific details are set forth in order to provide a thorough understanding of the implementations described herein. However, it will be understood by those of ordinary skill in the art that the implementations described herein may be practiced without these specific details. In other instances, well-known methods, procedures and components have not been described in detail so as not to obscure the implementations described herein. Also, the description is not to be considered as limiting the scope of the implementations described herein.

The detailed description set forth herein in connection with the appended drawings is intended as a description of exemplary embodiments in which the presently disclosed apparatus and system can be practiced. The term "exemplary" used throughout this description means "serving as an example, instance, or illustration," and should not necessarily be construed as preferred or advantageous over other embodiments.

The two philosophical statements made previously—"minimum work/change for maximum damage/exposure", and "a trojan can be viewed as a defect/fault/bug inserted by a human intelligence"—enable the analysis of a cybersecurity breach, e.g., a trojan infection of electronic system, to be viewed as a "single fault assumption". Therefore, all of the mathematics and tools applied to fault accounting and analysis may be used to consider the best location and impact of a trojan attack. These tools provide efficiency in the analytical process, as opposed to the brute force method of considering every gate as a possible location for multiple possible trojans, e.g., a 2-input AND-gate has 6 stuck-at faults—Stuck-at-1/0 on each input port and Stuck-at-1/0 on the output port, and 6 delay faults, slow-to-rise and slow-to-fall delay faults on those same ports. By way of example, fault mathematics state that for any given cone of logic, where several registers feed a mass of combinational logic that resolves to a single register, there are a number of faults that will resolve to a Stuck-at-1 and a number of faults that will resolve to a Stuck-at-0. The fault closest to the capture register that is a Stuck-at-1 may be the fundamental fault and all other faults in the cone of logic that resolve to the same value are the equivalent faults. During fault simulation, all faults that create the same effect at a monitored node, ideally a test point, are removed as detected, an operation known to one of ordinary skill in this art as fault collapsing. Similarly, in this manner, trojans may be evaluated as a reduced set of all possible trojans by focusing on fundamental trojans. This view of trojan insertion and trojan detection may allow other design methods to be considered when considering the placement of trojans, and subsequently, where to place instruments that can be used to detect anomalous circuit conditions and activity that can be attributed to trojan attacks.

There are several methods that can be used to evaluate where to put the trojan—functional analysis, mathematical analysis, and heuristic analysis. The mathematical analysis is a mathematical-based probability weighting analysis that may be combined with a heuristic analysis. The subject matter method discussed herein focuses on various aspects of the weighted controllability and observability analysis.

Weighted analysis may be one way the black hat attacker will approach the "where to put the Trojan problem". The black hat will want to understand the potential use of the electronic device and will want to install features that give them an advantage within the final deployed use of the electronics (semiconductor chips, boards or systems). FIG. 1 illustrates, in block diagram form, an exemplary electronic facility 100 that may be the subject of the aforementioned trojan attacks, and to the analytical methods described herein according to some embodiments. Electronic facility 100 is generally representative of electronic facilities that may be available in marine vessels, aircraft, and automobiles, and includes the digital and analog components of an exemplary pump control system. Electronic facility 100 may include an interface that comprises monitor 102, and Universal Asynchronous Receiver/Transmitter ("UART") 106. Electronic facility 100 may also include processor facility 108 that interfaces with monitor 102 by way of UART 106, as well as interfacing with boot Read Only Memory ("ROM") 110, program memory 112, and with bus 114. Electronic facility 100 may also include an exemplary pump controller 116 that communicates with bus 114 and with pump servo-motor control 118. Pump servo-motor control 118 communicates with the pump 122 via the pump interface 120.

A black hat attacker may apply a mathematical or probability-based analysis to a model of the electronic facility 100, where that model is written in a register-transfer language ("RTL"), e.g., Verilog or VHDL, as part of the effort to identify an optimal placement for a particular Trojan attack. One such probability-based method could be a Controllability-Observability analysis that is analogous to the Sandia Controllability-Observability Analysis Program ("SCOAP") as described in L. H. Goldstein, "Controllability/Observability Analysis of Digital Circuits," IEEE Trans. on Circuits and Systems, CAS-26(9): 685-693, September, 1979. Controllability-Observability analysis is the assignment of weighting factors to portions of the model that identify the relative ease or difficulty to control certain design elements and signals, i.e., to place a logic-1 or a logic-0 onto their input signals, and the subsequent relative ease or difficulty in observing the response or data of design elements. Controllability-Observability analysis has historically been used for assisting steering algorithms in automatic test-pattern generation (ATPG) programs used in the generation of ATPG patterns in electronic systems. By way of example, ATPG algorithms use back-tracing through cones of logic when establishing the exercising of a fault, or the justification of a propagation path for the fault. Often during back-tracing, the algorithm encounters a gate, e.g., an AND gate, that requires only a single input be set to a logic-0 value; all other inputs may be represented as a don't-care value, i.e., an X. The algorithm must determine the optimal input of the AND gate to set to the logic-0 value. For this example of an AND gate, a Controllability-Observability analysis of the circuit would develop a set of static numbers assigned to each input representing their respective levels of controllability and observability, and the algorithm would utilize the input with the "control-to-zero" value to provide the highest likelihood of completing the ATPG operation. At a more generalized sense for a Controllability-Observability analysis, each signal line has associated with its testability measures or probability weights: (i) $CC_0(l)$; (ii) $CO_1(l)$; and $CO(l)$. $CC_0(l)$ is the combinational 0-controllability of the signal line l; it represents the number of combinational assignments that must be made to other nodes in the circuit in order to set l to logic 0. The higher the value of $CC_0(l)$, the poorer the 0-controllability of l. $CO_1(l)$, the combinational 1-controllability, is similarly defined. The combinational observability $CO(l)$ is a measure of: (i) the number of combinational nodes between the node i and the primary outputs; and (ii) the number of combinational assignments necessary to propagate the value on to one of the primary outputs.

The use of Controllability-Observability analysis has not been used for the automated anticipation of Trojan attacks in electronic systems. Specifically, Controllability-Observability analysis has not been used when anticipating where an electronic Trojan may be placed in an electronic system. Nor has Controllability-Observability analysis been used to subsequently determining the placement of a Trojan detection instrument in the electronic system in order to reveal the presence of the Trojan and potentially enact countermeasures as a consequence of detecting the presence of the Trojan attack. Previous uses of Controllability-Observability analysis for vector generation have typically been applied to gate-level models (GLMs). For the purposes of predicting where an electronic Trojan may be placed and utilized, Controllability-Observability analysis may yield better results when applied to behavioral models (BEH or RTL) of the electronic system under investigation. A simplified form of the analysis can be modified and applied to an RTL model to identify which equations in the model should support the Trojan attack.

Figure 2:
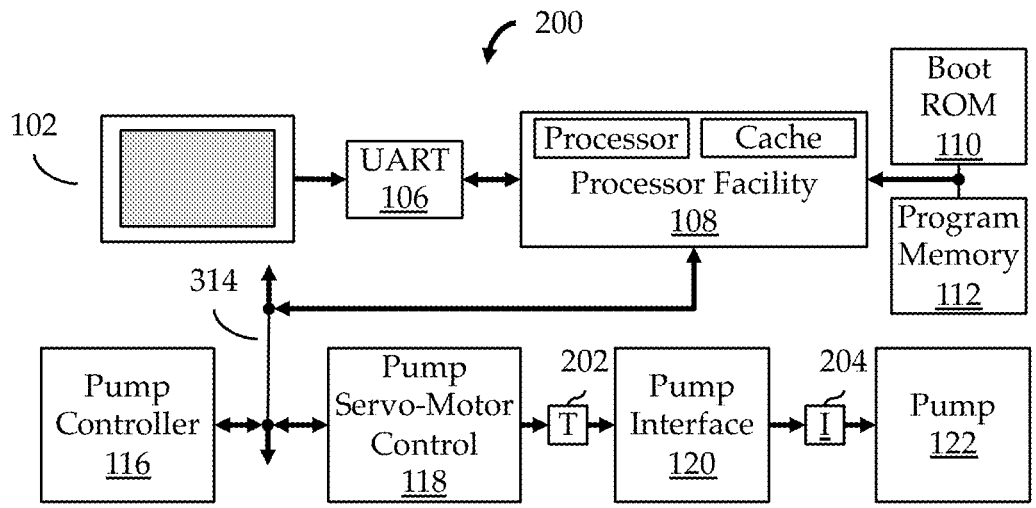
FIG. 2 illustrates, in block diagram form, the exemplary electronic facility of FIG. 1 modified to include trojans and instruments according some embodiments.

FIG. 2 illustrates, in block diagram form, the exemplary electronic facility 200 of FIG. 1 with a trojan circuit and an instrument detection circuit that may be the subject of the aforementioned trojan attacks, and to the analytical methods described herein according to some embodiments. Along with the elements of FIG. 1 already discussed earlier, the exemplary electronic facility 200 now may include trojan circuit 202 and instrument circuit 204, these two instantiations having been anticipated and predicted via the use of Controllability-Observability analysis discussed above. A more detailed discussion of the aforementioned Controllability-Observability analysis is warranted.

Figure 3A:
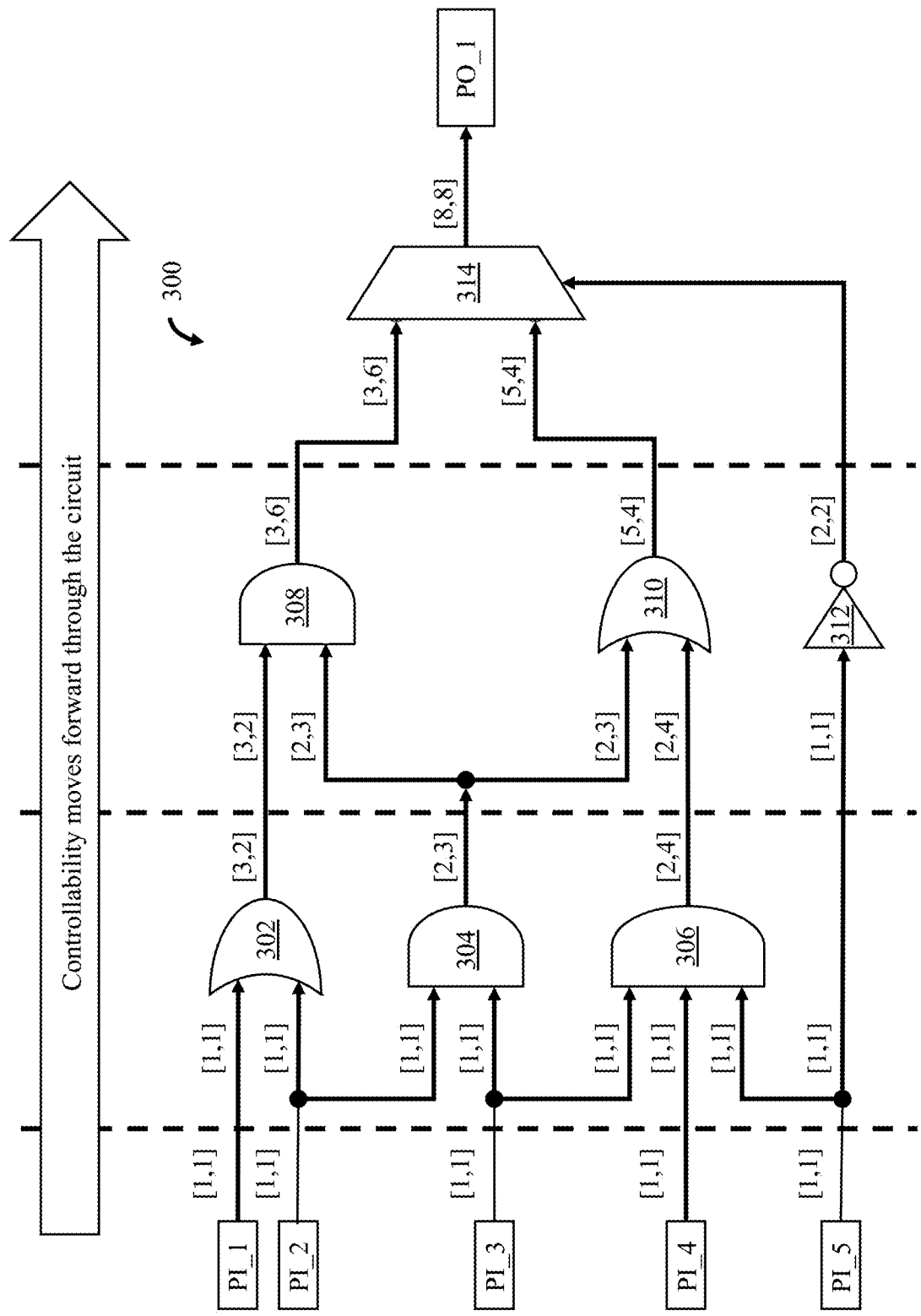
FIG. 3A illustrates, in schematic form, an exemplary cone of logic adapted to the analytical methods described herein, illustrating an initial controllability analysis according to some embodiments.

FIG. 3A illustrates, in logic schematic form, an exemplary cone of logic 300 adapted to the analytical methods described herein according to some embodiments. Logic cone 300 may include various primary inputs ("PI"), i.e., PI_1, PI_2, PI_3, PI_4, and PI_5, and primary outputs ("PO"), i.e., PO_1. Logic cone 300 may include 2-input OR-gate 302 receiving input from PI_1 and PI_2, 2-input AND-gate 304 receiving input from PI_2 and PI_3, and 3-input AND-gate 306 receiving input from PI_3, PI_4, and PI_5. Logic cone 300 may also include 2-input AND-gate 308 receiving input from the outputs of OR-gate 302 and AND-gate 304, as well as 2-input OR-gate 310 receiving input from the outputs of AND-gate 304 and AND-gate 306. Logic cone 300 may also include inverter 312 receiving input from PI_5 and delivering input to MUX circuit 314. MUX circuit 314 also receives input from AND-gate 308 and OR-gate 310 and develops the output PO_1.

Figure 4:
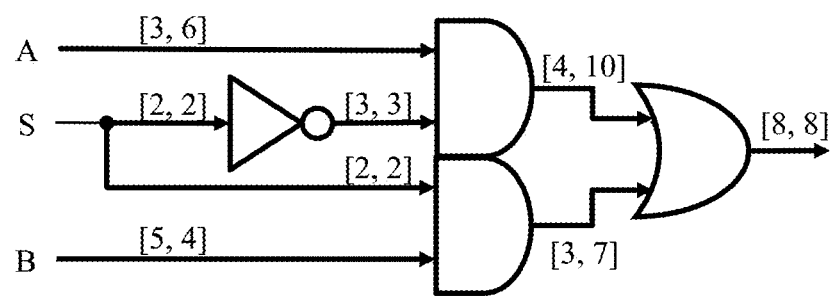
FIG. 4 illustrates, in schematic form, an exemplary 2-to-1 multiplexor adapted to the analytical methods described herein according to some embodiments.

Applying Controllability-Observability analysis to FIG. 3A begins by performing a Controllability analysis and developing a Controllability map. This process begins at the inputs of the logic cone 300 by selecting a Controllability Value, e.g., Control-to-Logic-0. The data inputs to logic cone 300 are each provided a weighting value of 1 because they are each directly accessible. By way of example, PI_1 through PI_5 of logic cone 300 are each set to the value [1,1], representing a Control-to-Logic-0 weighting value of 1 and a Control-to-Logic-1 weighting value of 1. A 2-input OR-gate, e.g., OR-gate 302, requires only a single input to be a logic-1 value to place a logic-1 on the output, thus, the Control-to-Logic-1 value would be set to 2, because the action of the gate adds a weight factor of 1 to the input weight factor of 1. Likewise, for the 2-input OR-gate 302 requires both inputs to be logic-0 values to place a logic-0 on the output, thus, the Control-to-Logic-0 value would be set to 3 since the action of the gate adds a weight factor of 1 to the 2 individual input weight factors of 1. According to the SCOAP algorithm, the probability weights for the output of 2-input OR-gate 302 would be set to [3,2], representing a Control-to-Logic-0 weighting value of 3 and a Control-to-Logic-1 weighting value of 2. Similarly, a 2-input AND-gate, e.g., AND-gate 304, requires only a single input to be a logic-0 value to place a logic-0 on the output, thus, the Control-to-Logic-0 would be set to 2, because the action of the gate adds a weight factor of 1 to the input weight factor of 1. Likewise, for the 2-input AND-gate 304 requires both inputs to be logic-1 value to place a logic-1 on the output, thus, the Control-to-Logic-1 value would be set to 3 since the action of the gate adds a weight factor of 1 to the 2 individual inputs weight factors of 1. Therefore, the probability weights for the output of the 2-input AND-gate 304 would be set to [2,3], representing a Control-to-Logic-0 weighting value of 2 and a Control-to-Logic-1 weighting value of 3. This Controllability analysis continues through the cone of logic 300 until a PO is reaches, e.g., PO_1. FIG. 4 illustrates, in schematic form, an exemplary 2-to-1 multiplexor adapted to the analytical methods described herein according to some embodiments. FIG. 4 illustrates the propagation of the probability weights on the inputs and select line to the output for MUX 314. Where AND type and OR type gates converge in the middle of the design, the lowest number available on inputs passes through the gate. For example, if a Control-to-Logic-1 analysis is being done into a 3-input OR-gate and one input has a number of 425 and the other two inputs have numbers greater than 550, the 425 passes through the OR-gate. Similarly, mathematical weighting for controllability can be applied to various gate types such as buffers, invertors, multiplexors and even data storage devices such as registers and latches. Low numbers represent easy to control, high numbers represent hard to control, and there is no limit on how high the numbers can range; they are limited only by the size and complexity of the circuit being evaluated.

After the initial controllability numbers are developed, observability weights may be assigned to the circuit under analysis. The observability process begins at the output terminal of a circuit by assigning a weighting factor of 0 on directly observable terminals, elements or test points. Passing backwards through the circuit, the controllability numbers are used to generate the observability numbers for any given gate element. By way of example, to observe the input of a 2-input AND-gate, whose output drives a directly observable terminal, the other input of the 2-input AND-gate must be set to an enabling value, e.g., a logic 1 value to pass a logic-1 or a logic-0 value. The value, therefore, of the observable node is the Control-to-Logic-1 weighting value incremented by 1 for passing through the gate and incremented by the observability weight on the output node, in our case a weight value of 0. As an example, if the Control-to-Logic-1 value on the B-input of the 2-input AND-gate was 1259, then the observe weighting value on the A-input would be 1259+1+0=1261. As with the controllability number, when there are multiple fan-ins to different gates that source from one point, the lowest observability number calculated on the multiple end points dominates.

Figure 3B:
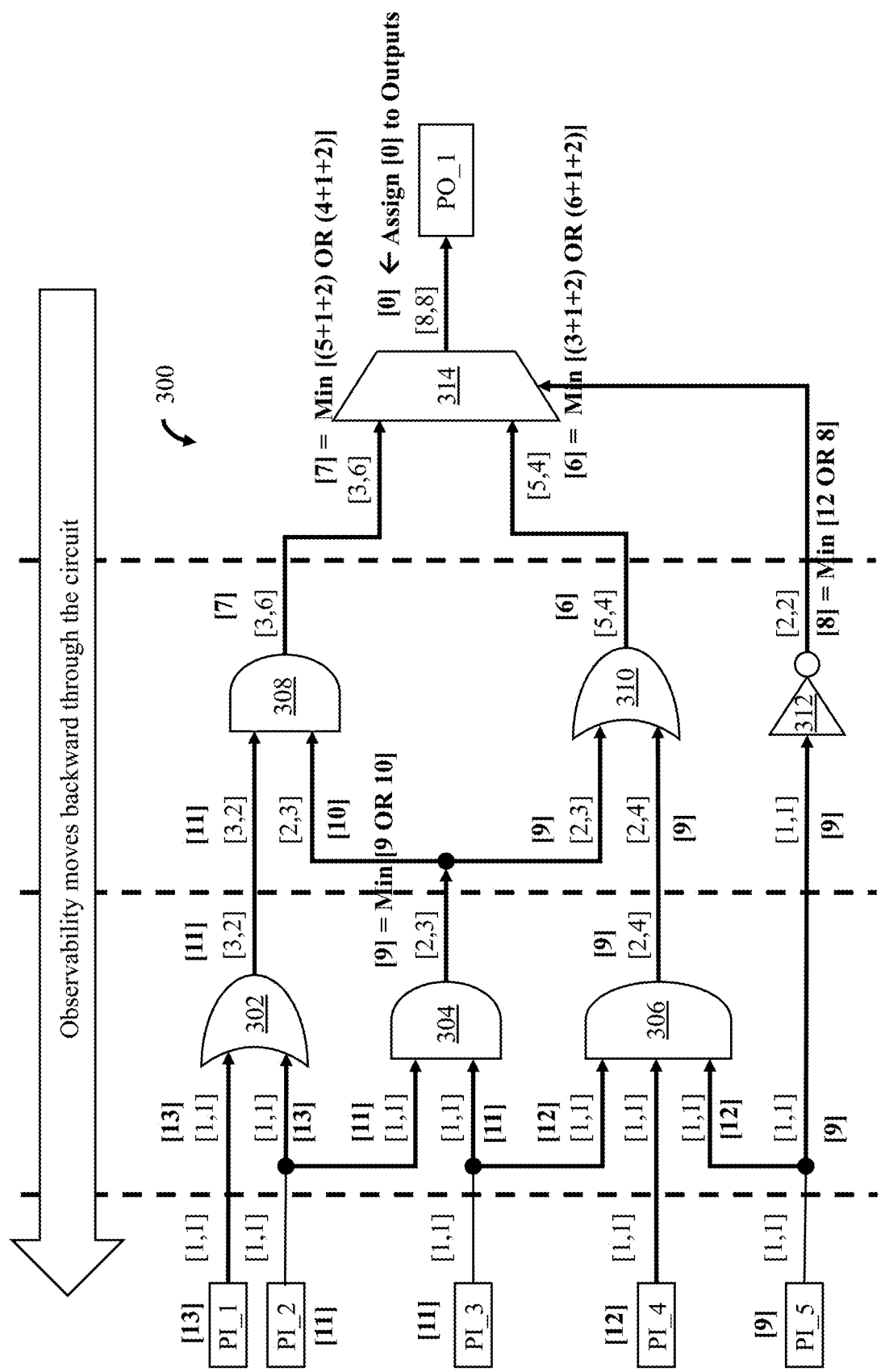
FIG. 3B illustrates, in schematic form, the exemplary cone of logic of FIG. 3A adapted to the analytical methods described herein, illustrating an initial observability analysis according to some embodiments.

By way of example, FIG. 3B illustrates, in schematic form, the exemplary cone of logic 300 of FIG. 3A adapted to the analytical methods described herein, illustrating an initial observability analysis according to some embodiments. Applying Observability analysis to logic cone 300 begins at the primary output PO_1. PO_1 is provided a weighting factory of 0, representing a directly observable output, test point, or element. According to SCOAP, for OR type gates, the Observability value on the output of the gate is incremented by 1 for passing through the gate, and then add the sum of the Control-to-Logic-0 values on all other inputs. Likewise, for AND type gates, the Observability value on the output of the gate is incremented by 1 for passing through the gate, and then add the sum of the Control-to-Logic-1 values on all other inputs. The mux values are calculated using the schematic of FIG. 4. Using this process, the observability weighting factor developed at the two inputs of MUX 314 are 7 and 6 as illustrated here in FIG. 3B. Working backwards thru the logic cone 300, an observability weighting factor of 11 is developed on the output of OR-gate 302, an observability weighting factor of 9 is developed on the output of AND-gate 304, an observability weighting factor of 9 is developed on the output of AND-gate 309. These numbers propagate back to the primary inputs, developing an observability weighting factor of 13 on the primary input PI_1, an observability weighting factor of 11 on the primary input PI_2, an observability weighting factor of 11 on the primary input PI_3, an observability weighting factor of 12 on the primary input PI_4, an observability weighting factor of 9 on the primary input PI_5.

For designs that utilize registers in a full-scan configuration, when the analysis is being done in a scan testing evaluation, the registers in the full-scan configuration represent directly accessible test points and thus, may be eliminated from the analysis as sequential elements. However, if the operation being analyzed is the functional operation where the register is being used as a non-scan sequential element, then the D-to-Q or D-to-QBar analysis can be calculated for observability and controllability numbers and the Reset, Clock-Enable, Data-Enable and other functional signals on the register must be analyzed as part of the mathematical numerical weighting assignment, i.e., evaluate the values of the Control-to-Logic-1 weighting values on the Reset, Clock-Enable or Data-Enable lines.

When using Controllability-Observability analysis to evaluate testability, the static numbers that are generated and assigned provide assistance in steering of the ATPG software at hard to test regions of the design under test. However, when using Controllability-Observability analysis to evaluate Trojan and Trojan detection instrument placement, it is the change in numbers, i.e., the delta, before and after the insertion of the Trojan that is most important. The potential placement of a Trojan, and its trigger if one exists, may be characterized as a placement that will not be accidently triggered or uncovered during testing and characterization of the device or system. The optimal placement may be characterized as those locations as having the highest controllability numbers and where the location meets a Trojan attack goal. High controllability weights mean that there is a small probability that a random vector will exercise the Trojan node or create the trigger condition. Similarly, if an ATPG algorithm is tasked with generating test vectors for the device or system, the ATPG algorithm will most-likely find alternate, easier pathways to complete a vector other than the pathways with the highest controllability numbers.

When evaluating a circuit or system for vulnerabilities, the black hat may generate the controllability numbers and then overlay a set of Trojan attack conditions. Such Trojan attack conditions may include: preventing a particular single wire or "single point of failure" from transitioning, thus, creating a kill switch; multiplexing a single wire or "single access point" to take over a function; disrupting the proper logical value or logic sequence from being delivered to a fan-out node or "break many endpoints node" that is widely distributed; and installing a fake fault in a critical location. In short, the Controllability-Observability analysis described above provides the necessary identification of nodes that are weighted as being hard to control and that align with the Trojan attack requirement.

Similarly, observability numbers or weights can also be used by the black hat as the means to deliver hidden or secret internal data, information or structure to an observable location. The Trojan would be the completion of a pathway from the important data to an observable spot. However, the activation of the Trojan may change the actual observability numbers. If a Trojan is placed in the logic circuit using any form of analysis, the placement of the Trojan and trigger will instantly change the controllability numbers. By way of example, if an OR-gate embedded deep within the design has controllability numbers on the target input in the high thousands, e.g., [C0,C1]=[12,903, 15,866]), then the placement of a 2-input OR as a Trojan with the A-input being the normal pathway and the B-input being a trigger routed to an unused pin immediately changes the control-to-1 number of the Trojan gate to a weight of 1. This in turn reduces the control-to-1 number of the target gate. In this example, the "inserted" Trojan gate, by our mathematical definition, would be invisible to the weighting math, such that the effect is that the Target gate would then take on [C0, C1]=[12,903, 1]. This change in controllability numbers would concomitantly change the observability numbers and may result in different pathways being dominant as observation points. The change in numbers may indicate that different natural pathways are evident as the normal operation vectors are applied. The change in numbers may indicate to the black hat that observation pathways for "leaker" type Trojans are now available.

From the white hat defender point of view, performing a substantially similar Observability analysis may reveal more optimal locations for Trojan detection instruments. The placement of a Trojan, i.e., AND-gates, OR-gates, and Muxes, results in a change in the weighting numbers, indicating a more preferable location for a Trojan detection instrument. Note, however, the goal of placing Trojan detection instruments is not simply to figure out where to put the instrument for every possible Trojan attack. There may be thousands of potential sites, resulting in a need to place thousands of potential Trojan detection instruments. If the Controllability-Observability map is modified by repeatedly inserting Trojans that meet the high controllability threshold, then the map would change differently for each attack. The ultimate goal, for efficiency, would be to overlay all of the modified maps and to identify overlapping areas where the observability numbers are low, e.g., easy propagation pathways or observability highways. Then Trojan detection instruments could be placed in those identified locations that would cover the effects of many multiple Trojans.

Figure 3C:
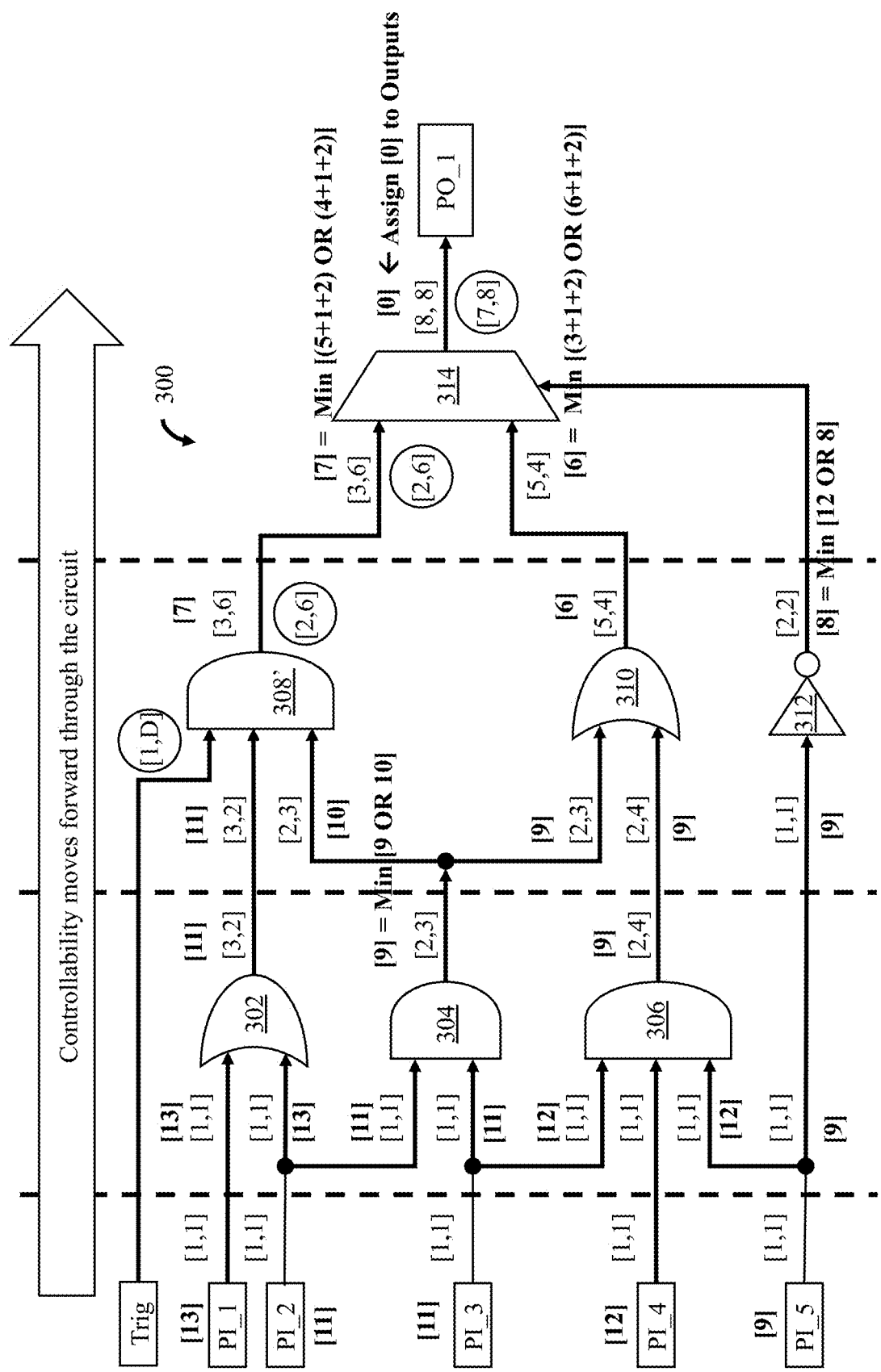
FIG. 3C illustrates, in schematic form, the exemplary cone of logic of FIG. 3A adapted to the analytical methods described herein, illustrating an insertion of a potential Trojan and the modifications to the controllability map due to a second pass controllability analysis.

By way of example, FIG. 3C illustrates, in schematic form, the exemplary cone of logic 300 of FIG. 3A adapted to the analytical methods described herein, illustrating an insertion of a potential Trojan and the modifications to the controllability map due to a second pass controllability analysis. In this instance, 2-input AND-gate 308 has been replaced with a 3-input AND-gate 308'. As before, the AND-gate 308' receives its inputs from OR-gate 302 and AND-gate 304. However, it also now receives an input from a trigger input, here labeled "Trig". The input of AND-gate 308' connected to the Trig input changes the Control-to-Logic-0 weight to 1, as a logic 0 on that input is a controlling value for the gate, and the Control-to-Logic-1 weight is defined as a D, e.g., its default value, as a logic 1 value on that input is a non-controlling value. In effect, the inserted Trojan, AND-gate 308', is now available to act as a kill switch for the output of AND-gate 308'. As illustrated, the insertion of Trojan AND-gate 308' modifies the downstream controllability weights, i.e., the controllability weights of the output net of AND-gate 308' is now [2,6], the Control-to-Logic-0 would be reduced to 2, because the action of the gate adds a weight factor of 1 to the input weight factor of 1 from the trigger input. This modified weighting factor propagates through the mux, resulting in a reduced Control-to-Logic-0 number on PO_1 output. Controllability weighting numbers modified by the insertion of a Trojan are illustrated as circled pairs.

Figure 3D:
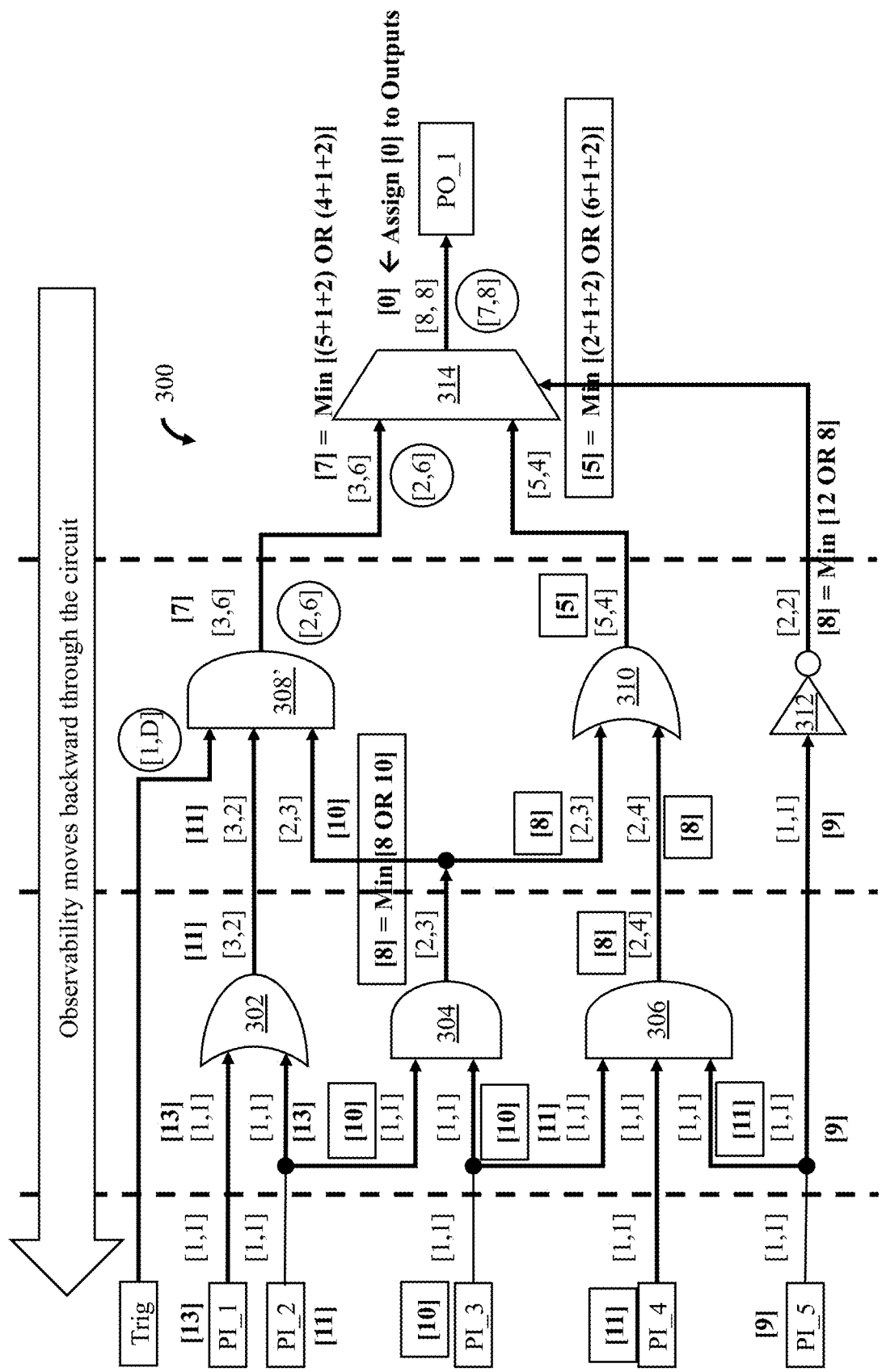
FIG. 3D illustrates, in schematic form, the exemplary cone of logic of FIG. 3C adapted to the analytical methods described herein, illustrating an insertion of a potential Trojan and the modifications to the observability map due to a second pass observability analysis.

Utilizing the controllability weighting numbers developed and illustrated in FIG. 3C, and by way of example, FIG. 3D illustrates, in schematic form, the exemplary cone of logic 300 of FIG. 3C adapted to the analytical methods described herein, illustrating an insertion of a potential Trojan and the modifications to the observability map due to a second pass observability analysis. This second pass analysis illustrates the back-propagation of the new controllability map, and the impact it has on the observability numbers and the concomitant reduction in observability. This reduction in observability weighting numbers provides insight as to where Trojan detection instruments may be placed. As illustrated by the boxed numbers, the observability weight of the output of OR-gate 310 has been reduced from 6 to 5 by the insertion of the previously mentioned Trojan AND-gate 308'. Those reduced observability numbers continue to back-propagate thru logic cone 300, resulting in the observability numbers of PI_3 and PI_4 being reduced to 10 and 11 respectively.

Figure 6A:
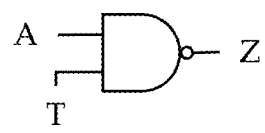
FIG. 6A illustrates, in schematic form, an exemplary NAND-gate trojan according to some embodiments.
Figure 6B:
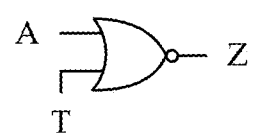
FIG. 6B illustrates, in schematic form, an exemplary NOR-gate trojan according to some embodiments.

In a different embodiment, a Golden Model may be synthesized into a simple gate-level model and the analysis can be applied to the gates. The goal is to identify areas of high and low controllability and observability numbers and these should not change significantly for different synthesis targets. However, ideally, this analysis could be applied to the RTL model. Many RTL modeling styles use almost standardized code styles to represent multiplexors, equations, and registers. By way of example, "assign" statements may represent combinational equations or gate equations. "If-then" statements may be used for multiplexors. 'Always-at" statements may be used to represent sequential elements. For these types of Golden Verilog Models, i.e., structured RTL, the mathematical assignment of weights can be accomplished with largely the same results as operating on the gate-level model. The overall goal is to identify "lines of code" that represent difficult controllability and conversely, easy observability. The lines of code can then be markered by the placement of a buffer with a specific naming convention to identify where in the code different types of Trojans may be inserted. A Trojan insertion step can then be used to substitute a Trojan gate, e.g., AND-gate, OR-gate, Mux, etc., for the marker and the Controllability-Observability analysis can be recalculated to provide new weighting numbers. FIG. 6A and FIG. 6B illustrates, in schematic form, an exemplary NAND-gate trojan and an exemplary NOR-gate trojan that may be included in a Trojan database according to some embodiments. These forms of analysis described herein may be referred to as a method is for cybersecurity-SCOAP.

Figure 5A:
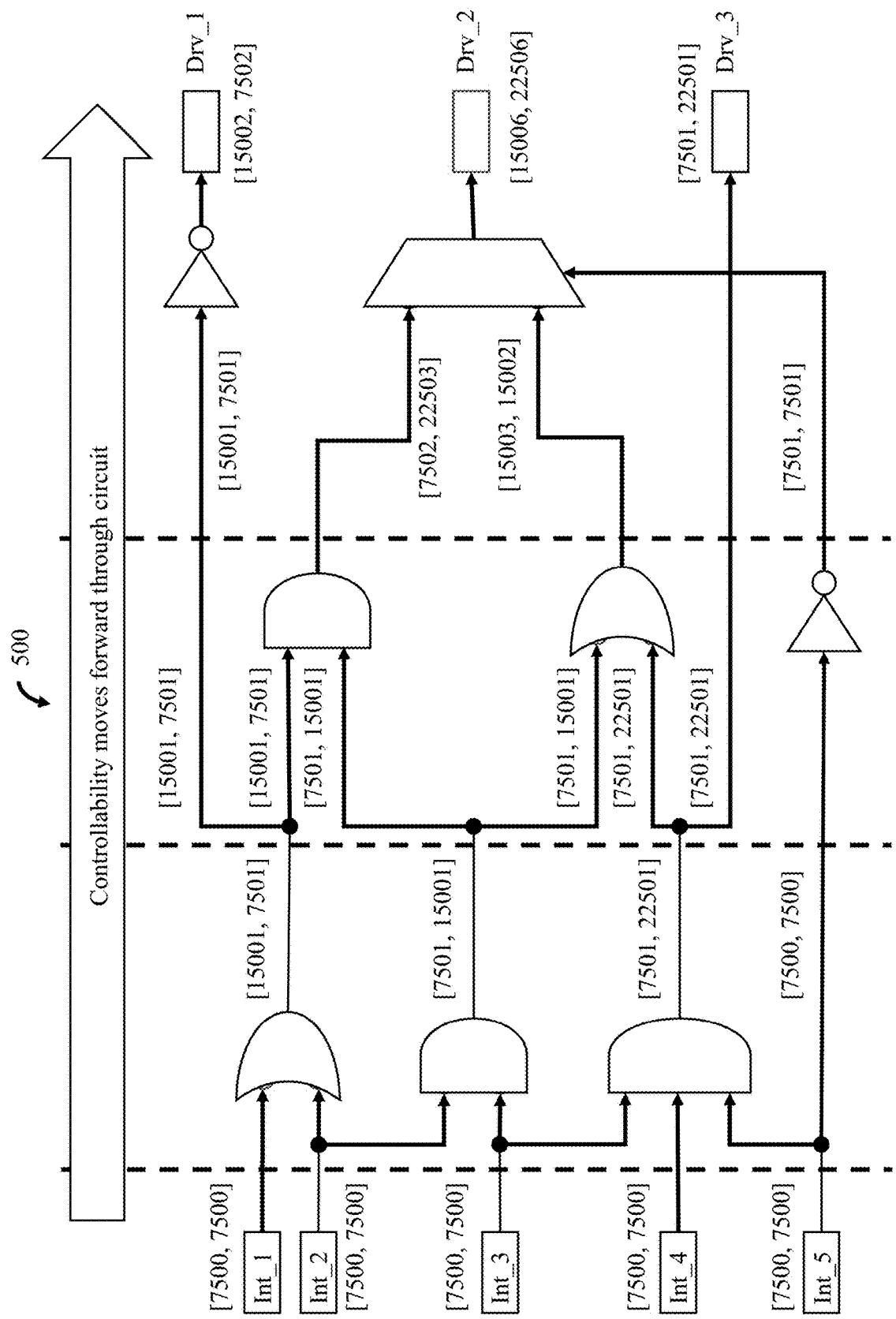
FIG. 5A illustrates, in schematic form, another exemplary cone of logic adapted to the analytical methods described herein, illustrating an initial controllability analysis according to some embodiments.

The weighting factors illustrated FIG. 3A-FIG. 3D are relatively small in comparison to factors that may be encountered in a substantially larger electronic facility. FIG. 5A illustrates, in schematic form, another exemplary cone of logic 500 adapted to the analytical methods described herein, illustrating an initial controllability analysis according to some embodiments. In this exemplary embodiment, it is assumed that the analysis performed is an in situ analysis of a cone of logic within the context of a much larger electronic facility, i.e., the electronic facility 200 of FIG. 2. Referring back to FIG. 2, Controllability analysis would start as before at the primary inputs and moves towards primary outputs—the deeper into the circuit the analysis propagates, generally, the higher the controllability weighting factors will become, indicative of an increasing difficulty to control the specific inputs of various logic elements. Referring back to FIG. 5A, this exemplary analysis assumes that logic cone 500 is in the middle of the much larger electronic facility 200 of FIG. 2, thus the inputs to logic cone 500 are signals internal to the electronic facility and therefore have substantially larger initial controllability weights on the inputs. For this exemplary analysis, the Control-to-Logic-0 and Control-to-Logic-1 values of the inputs are each set to [7500, 7500] so that one pathway is not predisposed over another—in reality, the inputs would likely be of different Controllability weights depending on the Controllability weights of the previous, upstream circuit.

Figure 5B:
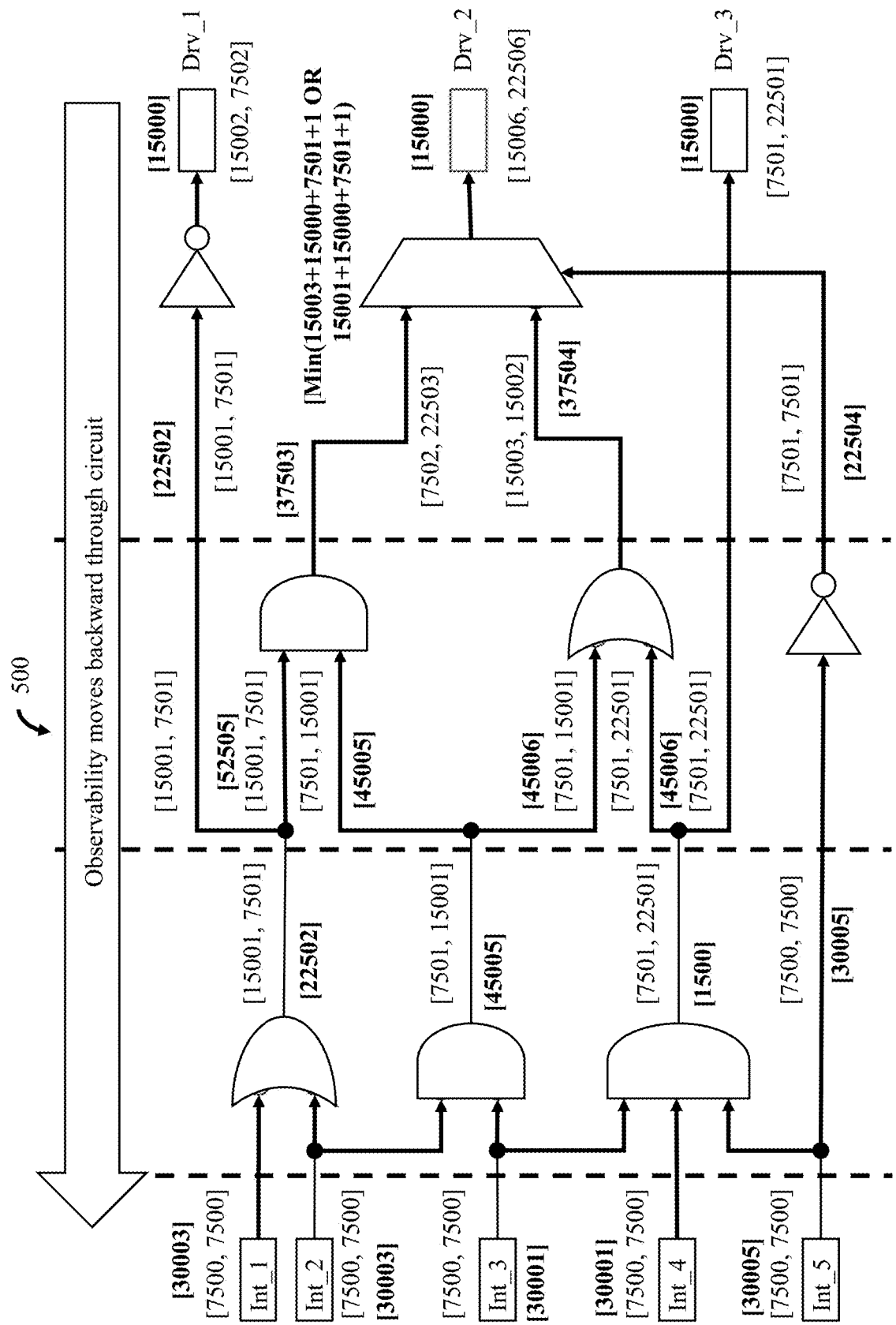
FIG. 5B illustrates, in schematic form, the exemplary cone of logic of FIG. 5A adapted to the analytical methods described herein, illustrating an initial observability analysis according to some embodiments.

FIG. 5B illustrates, in schematic form, the exemplary cone of logic 500 of FIG. 5A adapted to the analytical methods described herein, illustrating an initial observability analysis according to some embodiments. Here, as in the earlier example, Observability analysis begins at the outputs, Drv_1-Drv_3, and travel backwards toward the inputs. The deeper into the circuit the analysis propagates, generally, the higher the observability weighting factors will become, indicative of an increasing difficulty in observing the specific outputs of various logic elements. For this example analysis, the initial Observability weighting factors will each be set to [15000] so as not to predispose one pathway over another. Performing the analysis as before, it is observed that numerically by weighting, the path from Int_3 to Drv_2 through the Mux is the most difficult to observe.

Figure 5C:
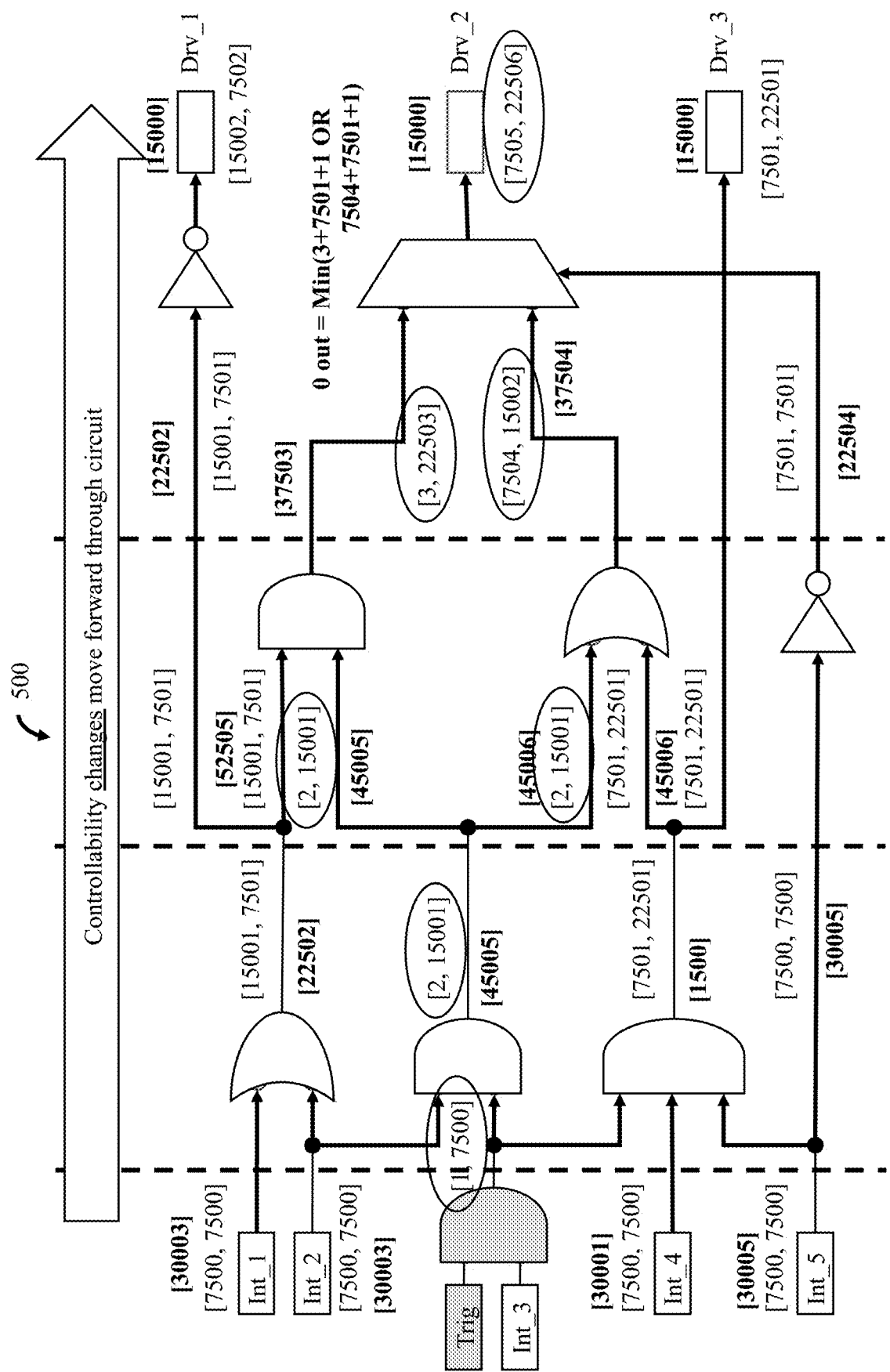
FIG. 5C illustrates, in schematic form, the exemplary cone of logic of FIG. 5A adapted to the analytical methods described herein, illustrating an insertion of a potential Trojan and the modifications to the controllability map due to a second pass controllability analysis.

FIG. 5C illustrates, in schematic form, the exemplary cone of logic of FIG. 5A adapted to the analytical methods described herein, illustrating an insertion of a potential Trojan and the modifications to the controllability map due to a second pass controllability analysis. Because numerically, the path from Int_3 to Drv_2 through the Mux is both difficult to control and difficult to observe, according to the methods disclosed herein, this path is a candidate for a Trojan insertion and continued analysis. It is worth noting that Int_2 will be ruled by the analysis because it may not support a Trojan—Int_2 may not be a [1,D] and a [D,0] at the same time, i.e., the first level input gates are both OR and AND, the Trojan would be instantly discovered. Numerically, the Trojan with the most widely spread impact would be a Trojan at Int_3 because a Trojan at this point would impact data going through both sides of the Mux. Placing an AND-type Trojan at Int_3, where the Controllability weighting factors are not set to a [1,D] and performing a second pass of the Controllability-Observability analysis demonstrates the lowered Controllability weighting factors propagating through the logic cone 500, dramatically altering the Control-to-Logic-0 weights for the path leading from Int_3 to Drv_2 through the Mux.

Figure 5D:
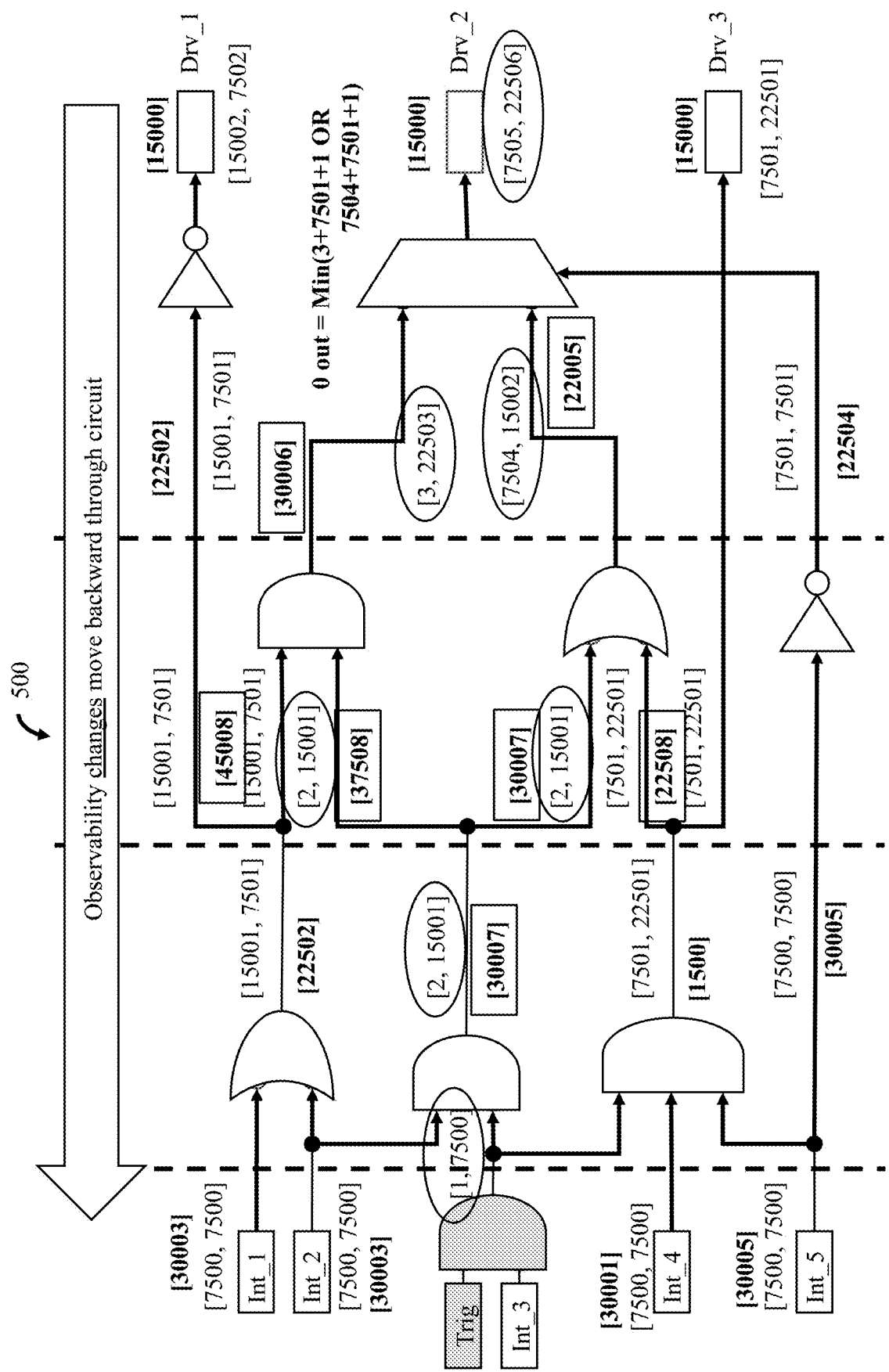
FIG. 5D illustrates, in schematic form, the exemplary cone of logic of FIG. 5C adapted to the analytical methods described herein, illustrating an insertion of a potential Trojan and the modifications to the observability map due to a second pass observability analysis.

Lastly, FIG. 5D illustrates, in schematic form, the exemplary cone of logic 500 of FIG. 5C adapted to the analytical methods described herein, illustrating an insertion of a potential Trojan and the modifications to the observability map due to a second pass observability analysis. Using the update Controllability weighting factors, a second Observability analysis is performed, propagating the changes to the Observability weighting factors backwards through the cone of logic 500. Note that the Trojan affected Control-to-0 values through the circuit—these controllability numbers changed the observability numbers to make the lower path from Int_3 through the MUX more observable. This would be the path that is preferable for the placement of a detection instrument.

Mathematical analysis uses a scoring system to make generalizations about the design. One possible mathematical analysis is a Controllability-Observability weighting where, for example, the Gate-Level Model (GLM) can be analyzed for how controllable and how observable individual gate or route logic values are within the design (e.g. a logic 1 on the output of a deeply embedded AND-gate would require how much work to observe on several possible observe points such as output pins or functionally accessible registers? And what is the difficulty of controlling both inputs of that AND-gate to logic 1?). Controllability-Observability analysis has been used in the past to help steer automatic-test-pattern-generation (ATPG), but it has not been used to determine where a Trojan attack should be placed (controllability) or where a Trojan detection instrument should be placed (observability).

Heuristic analysis makes use of the nature of the Trojan attack with respect to the device under attack's design. Trojan attacks deliver three fundamental types of payloads: 1) Leakers; 2) Behavior Modifiers; and 3) Reliability Impacts. Leakers focus on something internal that is important such as embedded codes, banking numbers, encryption keys, etc., so identifying these items and then identifying the pathways that they could be presented to the outside of the device can bound the attack space and the detection space. Behavior modifiers focus on the types of design structures that would easily provide a kill switch, a take-over or the application of an alternate function. Generally speaking, this means a pinch-point, single point of failure, or single function with wide fanout that provides the ability to break or take control of a single signal (minimum work—maximum damage) to meet the attacker's goals. Reliability impact attacks focus on either making a device seem unreliable by the use of spoofed or fake faults; or by the decrease of the device's lifetime using thermal overload, excessive switching or by forcing a direct power-to-ground short. These types of attacks can leave parametric fingerprints within the device such as excessive leakage current, higher than normal power consumption, and higher than normal operating temperatures.

Figure 7:
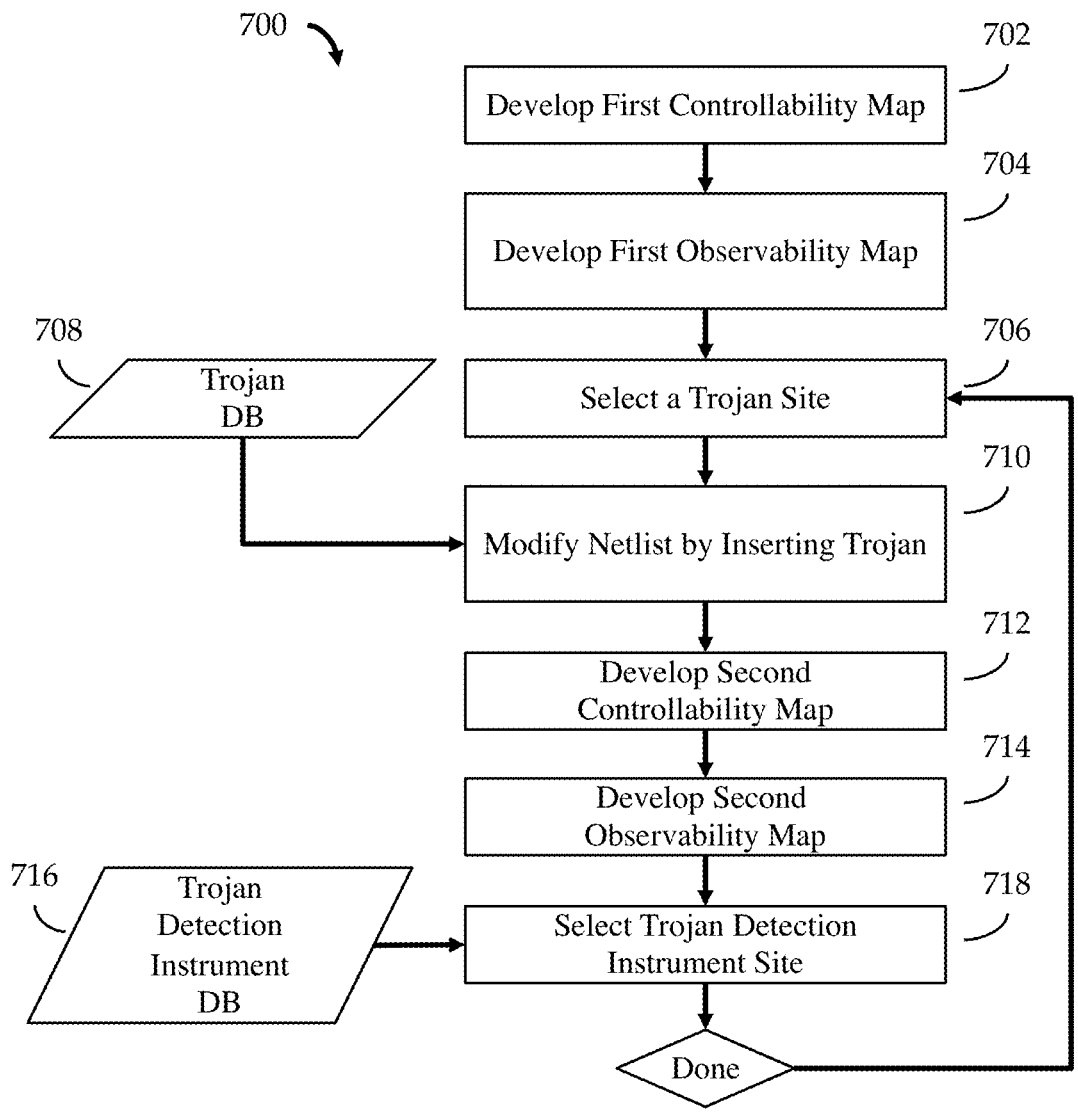
FIG. 7 illustrates in flow chart form, operation of the analytical methods described herein according to some embodiments.

FIG. 7 illustrates in flow chart form, operation of the analytical methods 700 described herein according to some embodiments. As discussed above, the method for selection of a location for placement and insertion of a Trojan circuit and, if needed, its associated trigger, or an Trojan detection instrument circuit begins with the step 702 of developing a baseline controllability map of the netlist representing the electronic facility under analysis. As has been illustrated above, this controllability map includes controllability weighting factors. Next, a baseline observability map of the netlist representing the electronic facility is developed, as illustrated at 704. As illustrated above, this map includes observability weighting factors that are developed as a function of the controllability weighting factors, i.e., the controllability numbers are used to generate the observability numbers for any given gate element. Based upon the controllability weighting factors, a Trojan site is selected, as illustrated in step 706, a Trojan is selected from a Trojan database 708, and the netlist representing the electronic facility is modified by inserting the selected Trojan at the Trojan site, as illustrated in step 710. With the Trojan circuit inserted into the netlist, a controllability map of the "infected" netlist is developed, as illustrated in Step 712, where the infected controllability weighting factors are a function of the newly infected Trojan circuit, i.e., the insertion of Trojan circuit modifies the downstream controllability weighting factors. Next, a second pass observability map of the "infected" netlist is developed, as illustrated in Step 714, where the newly developed, or infected, observability weighting factors are a function of the new controllability weighting factors. A Trojan detection instrument may be selected from a Trojan detection instrument database 716 and the, based upon these newly developed observability weighting factors, a Trojan detection instrument site is selected, as illustrated in step 718 of FIG. 7. The Trojan detection instrument site may also be impacted by the type of Trojan detection instrument selected from Trojan detection instrument database 716. Finally, as discussed earlier, the goal is to evaluate the electronic facility netlist to determine a potential Trojan sites, and associated Trojan detection instrument sites, wherein the Trojan detection instruments could be placed in those identified locations that would cover the effects of many multiple Trojans. Therefore, as illustrated in the method 700 flow chart, the method may loop back to select another Trojan site, and continue the analysis until a sufficient number of Trojans have been evaluated. By way of example, a preliminary analysis may be performed wherein a selected number of high fan-in logic cones are selected, where the high fan-in cones terminate in a single pinch point, thus providing a possible location for a behavior modifier Trojan such as a kill switch. Logic cones of this type might be typified by logic such as the program counter and its associated state machine in a microprocessor.

Thus, it will be apparent to one of ordinary skill that this disclosure provides for improved methods, systems, and apparatus for security assurance, protection, monitoring and analysis of facilities and electronic systems including circuits, such as integrated circuits, in relation to hardware trojans.

Apparatus, methods and systems according to embodiments of the disclosure are described. Although specific embodiments are illustrated and described herein, it will be appreciated by those of ordinary skill in the art that any arrangement which is calculated to achieve the same purposes can be substituted for the specific embodiments shown. This application is intended to cover any adaptations or variations of the embodiments and disclosure. For example, although described in terminology and terms common to the field of art, exemplary embodiments, systems, methods and apparatus described herein, one of ordinary skill in the art will appreciate that implementations can be made for other fields of art, systems, apparatus or methods that provide the required functions. The invention should therefore not be limited by the above described embodiment, method, and examples, but by all embodiments and methods within the scope and spirit of the invention.

In particular, one of ordinary skill in the art will readily appreciate that the names of the methods and apparatus are not intended to limit embodiments or the disclosure. Furthermore, additional methods, steps, and apparatus can be added to the components, functions can be rearranged among the components, and new components to correspond to future enhancements and physical devices used in embodiments can be introduced without departing from the scope of embodiments and the disclosure. One of skill in the art will readily recognize that embodiments are applicable to future systems, future apparatus, future methods, and different materials.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope of the disclosure unless otherwise claimed. No language in the specification should be construed as indicating any non-claimed element as essential to the practice of the disclosure as used herein.

Terminology used in the present disclosure is intended to include all environments and alternate technologies that provide the same functionality described herein.

What is claimed is:

1. In a computer implemented trojan analysis system, a method for selection of a location for placement and insertion of a selected one of a trojan circuit and an instrument circuit within an electronic facility, said electronic facility represented as a netlist called an electronic facility netlist, using a weighted controllability and observability analysis, said method comprising steps of:
   [1.0] developing a first controllability map of said electronic facility netlist, said first controllability map comprising a first plurality of controllability weighting factors;
   [2.0] developing a first observability map of said electronic facility netlist as a function of developing said first plurality of controllability weighting factors, said first observability map comprising a first plurality of observability weighting factors;
   [3.0] selecting a trojan site as a function of selecting said first plurality of controllability weighting factors;
   [4.0] modifying said electronic facility netlist by inserting a trojan circuit into said electronic facility netlist at said trojan site;
   [5.0] developing a second controllability map of said modified electronic facility netlist as a function of developing said trojan circuit, said second controllability map comprising a second plurality of controllability weighting factors;
   [6.0] developing a second observability map of said electronic facility netlist as a function of developing said second plurality of controllability weighting factors, said second observability map comprising a second plurality of observability weighting factors;
   [7.0] selecting a trojan detection instrument site as a function of selecting said second plurality of observability weighting factors; and
   [8.0] repeating steps [3.0] through [7.0] to develop a plurality of selected trojan sites and a plurality of selected trojan detection instrument sites.

2. The method of claim 1 wherein said selecting of said trojan site is further characterized as a function of selecting said first plurality of controllability weighting factors and said first plurality of observability weighting factors.

3. The method of claim 1 wherein said first plurality of controllability weighting factors is further characterized as comprising a Control-to-Logic-0 value and a Control-to-Logic-1 value.

4. The method of claim 1 wherein said second plurality of controllability weighting factors is further characterized as different from said first plurality of controllability weighting factors as a function of said trojan circuit.

5. The method of claim 1 wherein said second plurality of observability weighting factors is further characterized as different from said first plurality of observability weighting factors as a function of said trojan circuit.

6. In a computer implemented trojan analysis system, a method for selection of a location for placement and insertion of a trojan circuit within an electronic facility, said electronic facility represented as a netlist called an electronic facility netlist, using a weighted controllability and observability analysis, said method comprising steps of:

[1.0] developing a first controllability map of said electronic facility netlist, said first controllability map comprising a first plurality of controllability weighting factors;

[2.0] developing a first observability map of said electronic facility netlist as a function of developing said first plurality of controllability weighting factors, said first observability map comprising a first plurality of observability weighting factors;

[3.0] selecting a trojan site as a function of selecting said first plurality of controllability weighting factors; and

[4.0] modifying said electronic facility netlist by inserting a trojan circuit into said electronic facility netlist at said trojan site.

7. The method of claim 6 wherein said selecting of said trojan site is further characterized as a function of selecting said first plurality of controllability weighting factors and said first plurality of observability weighting factors.

8. The method of claim 6 wherein said first plurality of controllability weighting factors is further characterized as comprising a Control-to-Logic-0 value and a Control-to-Logic-1 value.

* * * * *